United States Patent
Iozsef et al.

(10) Patent No.: US 7,180,378 B2
(45) Date of Patent: Feb. 20, 2007

(54) TUNABLE RING OSCILLATOR

(75) Inventors: Eric Iozsef, Toronto (CA); Hossein Shakiba, Richmond Hill (CA)

(73) Assignee: Gennum Corporation (CA)

( * ) Notice: Subject to any disclaimer, the term of this patent is extended or adjusted under 35 U.S.C. 154(b) by 62 days.

(21) Appl. No.: 10/981,048

(22) Filed: Nov. 4, 2004

(65) Prior Publication Data
US 2006/0091967 A1    May 4, 2006

(51) Int. Cl.
*H03K 3/03* (2006.01)
*H03L 7/00* (2006.01)
(52) U.S. Cl. .................. 331/57; 327/158; 327/163
(58) Field of Classification Search ............... 331/57; 327/158, 163
See application file for complete search history.

(56) References Cited

U.S. PATENT DOCUMENTS

| | | | |
|---|---|---|---|
| 4,884,041 A | 11/1989 | Walker | |
| 5,045,811 A | 9/1991 | Lewis | |
| 5,428,318 A | 6/1995 | Razavi | |
| 6,005,448 A | 12/1999 | Pickering et al. | |
| 6,259,330 B1 | 7/2001 | Arai | |
| 6,377,129 B1 | 4/2002 | Rhee et al. | |
| 6,396,358 B1 | 5/2002 | Poss et al. | |
| 6,531,974 B1 | 3/2003 | Callahan et al. | |
| 6,539,072 B1 * | 3/2003 | Donnelly et al. | 375/371 |
| 6,587,007 B2 * | 7/2003 | Exeter | 331/57 |
| 6,775,217 B1 | 8/2004 | Kato et al. | |
| 6,956,442 B2 * | 10/2005 | Groen et al. | 331/57 |
| 2003/0034849 A1 * | 2/2003 | Sanduleanu | 331/58 |

OTHER PUBLICATIONS

International Search Report dated Feb. 9, 2006.

* cited by examiner

*Primary Examiner*—Robert Pascal
*Assistant Examiner*—James Goodley
(74) *Attorney, Agent, or Firm*—Jones Day

(57) ABSTRACT

A tunable ring oscillator, in accordance with the teachings described herein, may include one or more delay circuits having a coarse tuning circuitry and a fine tuning circuitry. The coarse tuning circuitry may be used to set one of a minimum time delay or a maximum time delay as a function of a coarse tuning input. The fine tuning circuitry may be used to adjust between the minimum time delay and the maximum time delay as a function of a fine tuning input.

17 Claims, 5 Drawing Sheets

TUNABLE RING OSCILLATOR

FIELD

The technology described in this patent document relates generally to the field of controlled oscillators. More particularly, this patent document describes a tunable ring oscillator having both coarse and fine tuning inputs.

BACKGROUND AND SUMMARY

Ring oscillators, such as voltage controlled oscillators (VCOs), are commonly used in communications systems and particularly in phase locked loop (PLL) circuits. In many PLL applications it is often necessary to lock to a range of incoming frequencies. For example, frequency ranges of 2:1 or higher are not uncommon. Tunable ring oscillators may, for example, be used in a PLL to cover the range of required frequencies.

A tunable ring oscillator, in accordance with the teachings described herein, may include one or more delay circuits having a coarse tuning circuitry and a fine tuning circuitry. The coarse tuning circuitry may be used to set one of a minimum time delay or a maximum time delay as a function of a coarse tuning input. The fine tuning circuitry may be used to adjust between the minimum time delay and the maximum time delay as a function of a fine tuning input.

DETAILED DESCRIPTION

Figure 1:
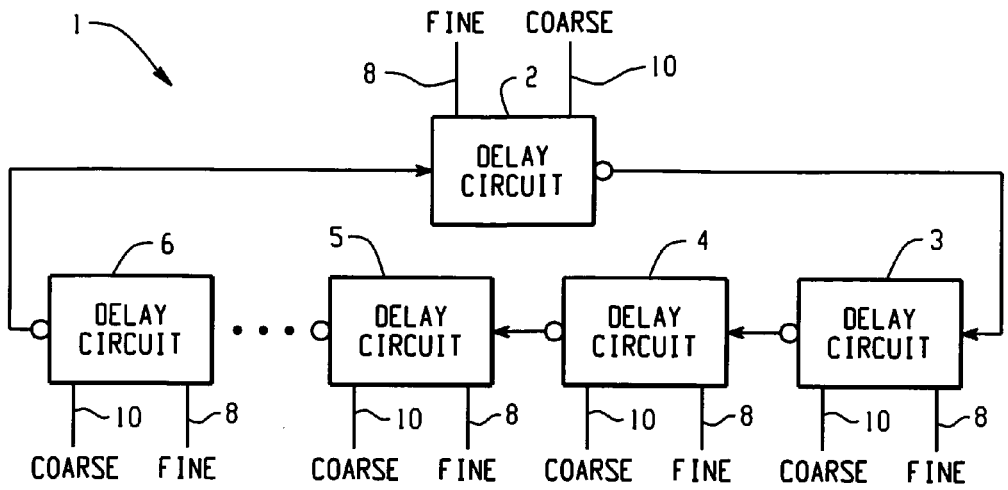
FIG. 1 is a block diagram of an example tunable ring oscillator having a plurality of delay circuits.

FIG. 1 is a block diagram of an example tunable ring oscillator 1 having a plurality of delay circuits 2–6 arranged in a ring topology. Each delay circuit 2–6 implements a controlled delay and inverts the signal to collectively generate an oscillating signal. In order to achieve an oscillating output, there should be an odd number of inversions around the ring 1. The resultant oscillating signal will have a period equal to twice the sum of the delays.

The length of the delay in each of the delay circuits 2–6, and thus the resultant operating frequency of the ring oscillator 1, is controlled by fine and coarse tuning inputs 8, 10. The coarse tuning inputs 10 may be used to select a frequency band for the ring oscillator 1, and the fine tuning inputs 8 may be used to tune the oscillator frequency within the selected frequency band. For example, the coarse tuning input may be a discrete input that is set to select the operating frequency band of the oscillator 1 and the fine tuning input may be an analog control for continuously tuning the oscillator 1 within the selected frequency band. For instance, in the case of a voltage controlled oscillator (VCO), the fine tuning input may be the control voltage input to the oscillator. In the illustrated example, the delay of each of the delay circuits 2–6 is controlled by the same fine and coarse tuning inputs 8, 10. In other examples, however, separate fine and/or coarse tuning inputs may be used for different delay circuits.

In one example, the length of the delay may be substantially equal in each of the delay circuits 2–6 to provide a desired number of phases of the oscillating signal. In addition, the number of delay circuits included in the ring may affect the available phases output from the oscillator. For instance, an even number of delay circuits with substantially equal delays may be used if the quadrature and inverted phases of the oscillating signal are needed.

In another example, one or more of the delay circuits 2–6 in FIG. 1 may be replaced by circuits or devices having a constant delay. For example, one or more of the delay circuits 2–6 may be replaced by inverters having a constant gate delay.

Figure 2:
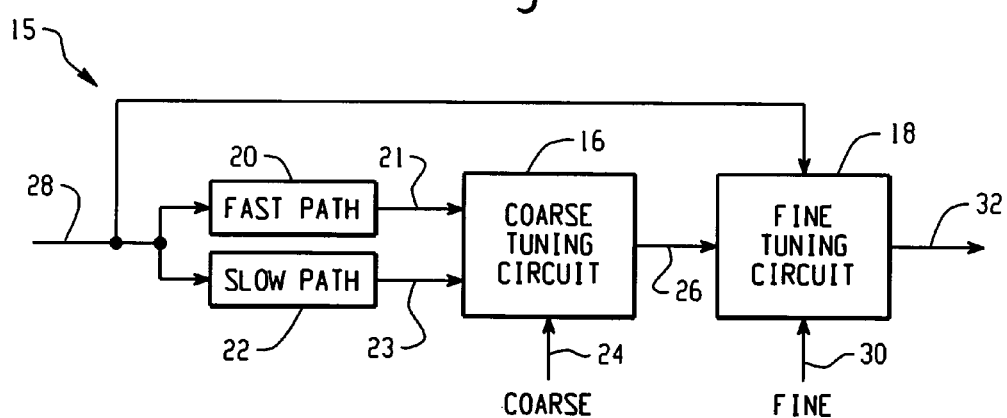
FIG. 2 is a block diagram of an example delay circuit for a tunable ring oscillator.

FIG. 2 is a block diagram of an example delay circuit 15 for a tunable ring oscillator. The circuit 15 includes a coarse tuning circuit 16 and a fine tuning circuit 18. Also included are a fast path 20 and a slow path 22. The fast and slow paths 20, 22 may, for example, be circuits or circuit elements having a shorter and a longer delay, respectively. Alternatively, the slow path 22 may be a circuit or circuit element having a fixed delay, and the fast path 20 may be a direct electrical connection bypassing the slow path 22.

The coarse tuning circuit 16 mixes the outputs 21, 23 from the fast path 20 and the slow path 22 as a function of a coarse tuning input 24 to generate a coarse tuned output signal 26. The coarse tuning circuit 16 may, for example, be a digital mixer having discrete settings selected by the coarse tuning input 24. For example, a minimum setting at the coarse tuning input 24 may cause the coarse tuning circuit 16 to include the time delay from the fast path 20 in the coarse tuned output signal 26, and a maximum setting at the coarse tuning input 24 may cause the coarse tuning circuit 16 to include the time delay from the slow path 22 in the coarse tuning output signal 26. A coarse tuning setting 24 between the minimum and maximum may cause the coarse tuning circuit 16 to delay the coarse tuning output signal 26 by an amount between the time delays of the fast and slow paths 20, 22.

The fine tuning circuit 18 mixes a delay circuit input signal 28 and the coarse tuned output signal 26 as a function of a fine tuning input 30 to generate a delay circuit output signal 32. The fine tuning circuit 18 may, for example, be an analog mixer that receives a control voltage at the fine tuning input 30 to control the time delay of the delay circuit 15 in a continuous manner. In the case of a VCO, for example, the fine tuning input 30 may be the control voltage input to the oscillator.

In operation, the coarse tuning circuit 16 sets a maximum time delay for the delay circuit 15. The fine tuning circuit 18 tunes the time delay of the delay circuit 15 within a range from a fixed minimum time delay to the maximum time delay set by the coarse tuning circuit 16.

Figure 3:
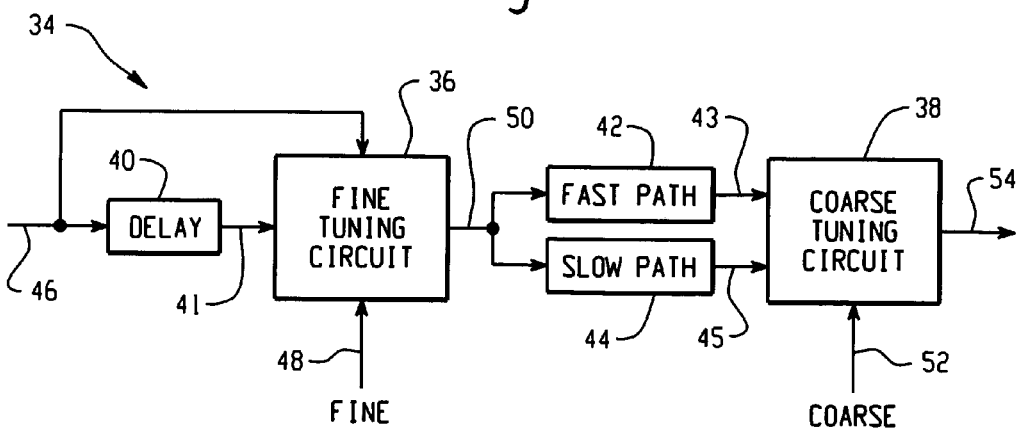
FIG. 3 is a block diagram of another example delay circuit for a tunable ring oscillator.

FIG. 3 is a block diagram of another example delay circuit 34 for a tunable ring oscillator. The circuit 34 includes a fine tuning circuit 36 and a coarse tuning circuit 38. Also included are a fixed time delay 40, a fast path 42 and a slow path 44. The fast and slow paths 42, 44 may, for example, be circuits or circuit elements having a shorter and a longer delay, respectively. Alternatively, the slow path 44 may be a circuit or circuit element having a fixed delay, and the fast path 42 may be a direct electrical connection bypassing the slow path 44. The fixed time delay 40 may, for example, be a buffer having a fixed gate delay.

The fine tuning circuit 36 mixes a delay circuit input signal 46 and the output 41 of the fixed time delay 40 as a function of a fine tuning input signal 48 to generate a fine tuned output signal 50. The fine tuning circuit 36 may, for example, be an analog mixer that receives a control voltage at the fine tuning input 48 to control the time delay of the delay circuit 34 in a continuous manner. In the case of a VCO, for example, the fine tuning input 48 may be the control voltage input to the oscillator.

The fine tuned output signal 50 is directed to the fast path 42 and the slow path 44, which delay the signal 50 by a shorter 44 and a longer 42 time delay, respectively. Alternatively, the fast path 42 may provide a direct electrical connection between the output 50 of the fine tuning circuit 36 and an input 43 of the coarse tuning circuit with no appreciable time delay. The coarse tuning circuit 38 mixes the outputs 43, 45 from the fast path 42 and the slow path 44 as a function of a coarse tuning input 52 to generate a delay circuit output signal 54. The coarse tuning circuit 34 may, for example, be a digital mixer having discrete settings selected by the coarse tuning input 52. For example, a minimum setting at the coarse tuning input 52 may cause the coarse tuning circuit 38 to include the time delay from the fast path 42 in the delay circuit output signal 54, and a maximum setting at the coarse tuning input 52 may cause the coarse tuning circuit 38 to include the time delay from the slow path 44 in the delay circuit output signal 54. A coarse tuning setting 52 between the minimum and maximum may cause the coarse tuning circuit 38 to delay the output signal 54 by an amount between the time delays of the fast and slow paths 42, 44.

In operation, the coarse tuning circuit 38 sets a minimum time delay for the delay circuit 34. The fine tuning circuit 36 tunes the time delay of the delay circuit 34 within a range from the minimum time delay set by the coarse tuning circuit 38 and a fixed maximum time delay.

Figure 4:
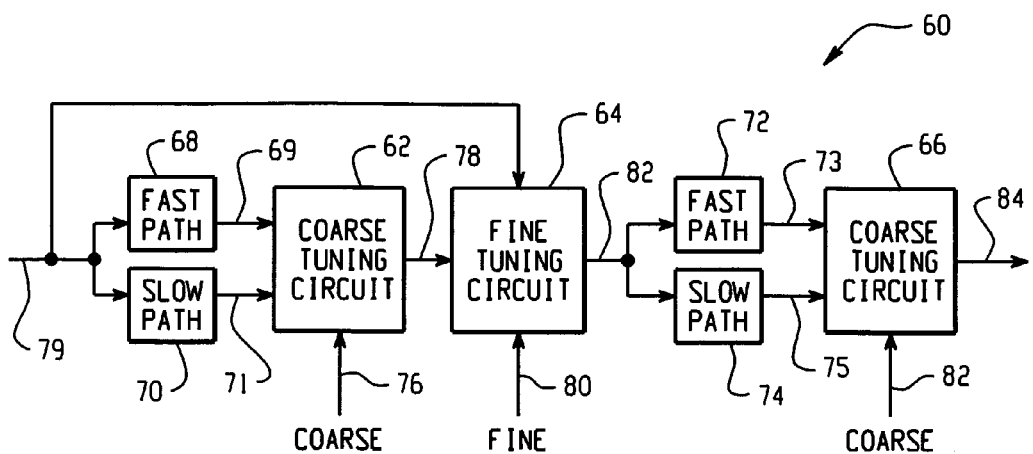
FIG. 4 is a block diagram of a third example delay circuit for a tunable ring oscillator.

FIG. 4 is a block diagram of a third example delay circuit 60 for a tunable ring oscillator. The circuit 60 includes a first coarse tuning circuit 62, a fine tuning circuit 64 and a second coarse tuning circuit 66. Also included are a first fast path 68, a first slow path 70, a second fast path 72 and a second slow path 74. The fast and slow paths 68, 70, 72, 74 may, for example, be circuits or circuit elements having shorter and longer delays, respectively. Alternatively, the slow paths 70, 74 may be circuits or circuit elements having fixed delays, and the fast paths 68, 72 may provide direct electrical connections without any appreciable delay.

The first coarse tuning circuit 62 mixes the outputs 69, 71 from the first fast path 68 and first slow path 70 as a function of a coarse tuning input 76 to generate a coarse tuned output signal 78. The coarse tuning circuit 62 may, for example, be a digital mixer having discrete settings selected by the coarse tuning input 76. For example, a minimum setting at the coarse tuning input 76 may cause the coarse tuning circuit 62 to include the time delay from the fast path 68 in the coarse tuned output 78, and a maximum setting at the coarse tuning input 76 may cause the coarse tuning circuit 62 to include the time delay from the slow path 70 in the coarse tuned output 78. A coarse tuning setting 76 between the minimum and maximum may cause the coarse tuning circuit 62 to delay the coarse tuned output signal 78 by an amount between the time delays of the fast and slow paths 68, 70.

The fine tuning circuit 64 mixes a delay circuit input signal 79 and the coarse tuned output signal 78 as a function of a fine tuning input 80 to generate a fine tuned output signal 82. The fine tuning circuit 64 may, for example, be an analog mixer that receives a control voltage at the fine tuning input 80 to control the time delay of the delay circuit 60 in a continuous manner. In the case of a VCO, for example, the fine tuning input 80 may be the control voltage input to the oscillator.

The fine tuned output signal 82 is directed to the second fast path 72 and the second slow path 74, which delay the signal 82 by a shorter 72 and a longer 74 time delay, respectively. Alternatively, the fast path 72 may provide a direct electrical connection between the output 82 of the fine tuning circuit 64 and an input 73 of the second coarse tuning circuit 66, with no appreciable time delay. The second coarse tuning circuit 66 mixes the outputs 73, 75 from the second fast path 72 and the second slow path 74 as a function of a coarse tuning input 82 to generate a delay circuit output signal 84. Similar to the first coarse tuning circuit 84, the second coarse tuning circuit 84 may be a digital mixer having discrete settings selected by the coarse tuning input 82.

In operation, the first coarse tuning circuit 62 sets a maximum time delay for the delay circuit 60, and the second coarse tuning circuit 66 sets a minimum time delay for the delay circuit 60. The fine tuning circuit 64 tunes the time delay of the delay circuit 60 within a range from the minimum time delay set by the second coarse tuning circuit 66 and the maximum time delay set by the first coarse tuning circuit 62.

In addition, the delay circuit 60 may provide a constant gain at each coarse tune settings 76, 82, or may provide a gain that varies depending on the coarse tune settings 76, 82. For example, if the same coarse tuning input is used for both the first and second coarse tuning circuits 62, 66 and the first and second coarse tuning circuits 62, 66 are weighted equally, then the delay circuit 60 may provide a constant gain. (See, e.g., FIG. 7.) A variable gain may be achieved by weighting the coarse settings differently in the first and second coarse tuning circuits 62, 66 or by using different coarse tune setting 76, 82 for the first and second coarse tuning circuits 62, 66. (See, e.g., FIG. 8.) In one example, the amount of time delay applied by the coarse tuning circuits 62, 66 at each discrete coarse tune setting 76, 80 may be programmable or otherwise selected by a person or machine.

Figure 5:
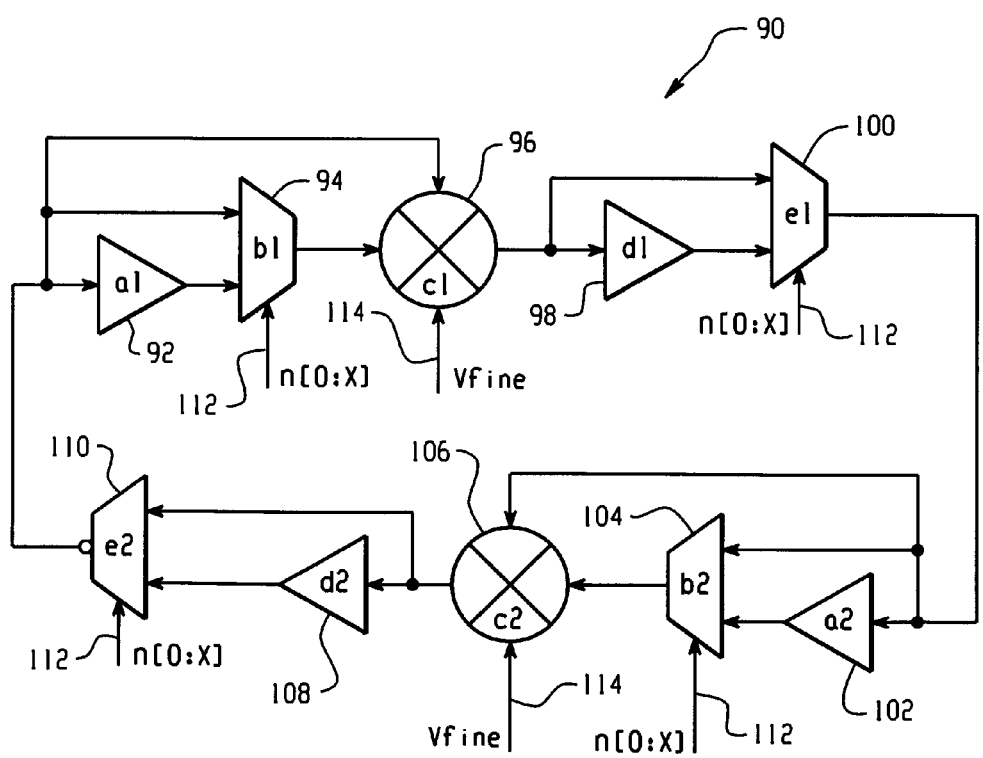
FIG. 5 is a block diagram of another example tunable ring oscillator.

FIG. 5 is a block diagram of another example tunable ring oscillator 90. The oscillator 90 includes two substantially identical delay circuits. The first delay circuit is labeled a1–e1, and the second delay circuit is labeled a2–e2. The two delay circuits are connected in series with the output of the second delay circuit (a2–e2) being inverted and fed back as the input of the first delay circuit (a1–e1), forming a ring oscillator 90. Each component in the delay circuits causes some amount of time delay, which is referred to herein by the labels a1–e1 and a2–e2. Because the two delay circuits are the same (e.g., a1=a2, b1=b2, etc.), only the operation of the first circuit (a1–e1) is described. It should be understood, however, that the total time delay through the ring 90 is substantially equal to twice the time delay of the first delay circuit (a1–e1).

The delay circuits include a first delay (a1, a2) 92, 102, a first digital mixer 94, 104 (b1, b2), an analog mixer (c1, c2) 96, 106, a second delay (d1, d2) 98, 108, and a second digital mixer (e1, e2) 100, 110. Also shown are a coarse tuning input 112 which is input to the first and second digital mixers 94, 100, 104, 110, and a fine tuning input 114 which is input to the analog mixers 96, 106. The coarse tuning input 112 may be a digital control word n[0:X], where X+1 is the number of bits in the digital word. The fine tuning input 114 may be an analog control voltage (Vfine).

In operation, the oscillator 90 mixes fast and slow delay paths according to the fine and coarse tuning inputs 112, 114 to control the operating frequency of the oscillator 90. The fast and slow paths are mixed by interpolating two time delays to produce a range of frequencies dependent upon the values of the two time delays. Coarse adjustments to the maximum and minimum frequencies and VCO gain are made with the discrete coarse tuning input 112. In particular, the minimum operating frequency (maximum delay) is controlled by the first digital mixers (b1, b2) 94, 104, and the maximum operating frequency (minimum delay) is controlled by the second digital mixers (e1, e2). Fine continuous adjustments between the maximum and minimum frequencies are made by the analog fine tuning input 114 to the analog mixers (c1, c2) 96, 114.

Figure 7:
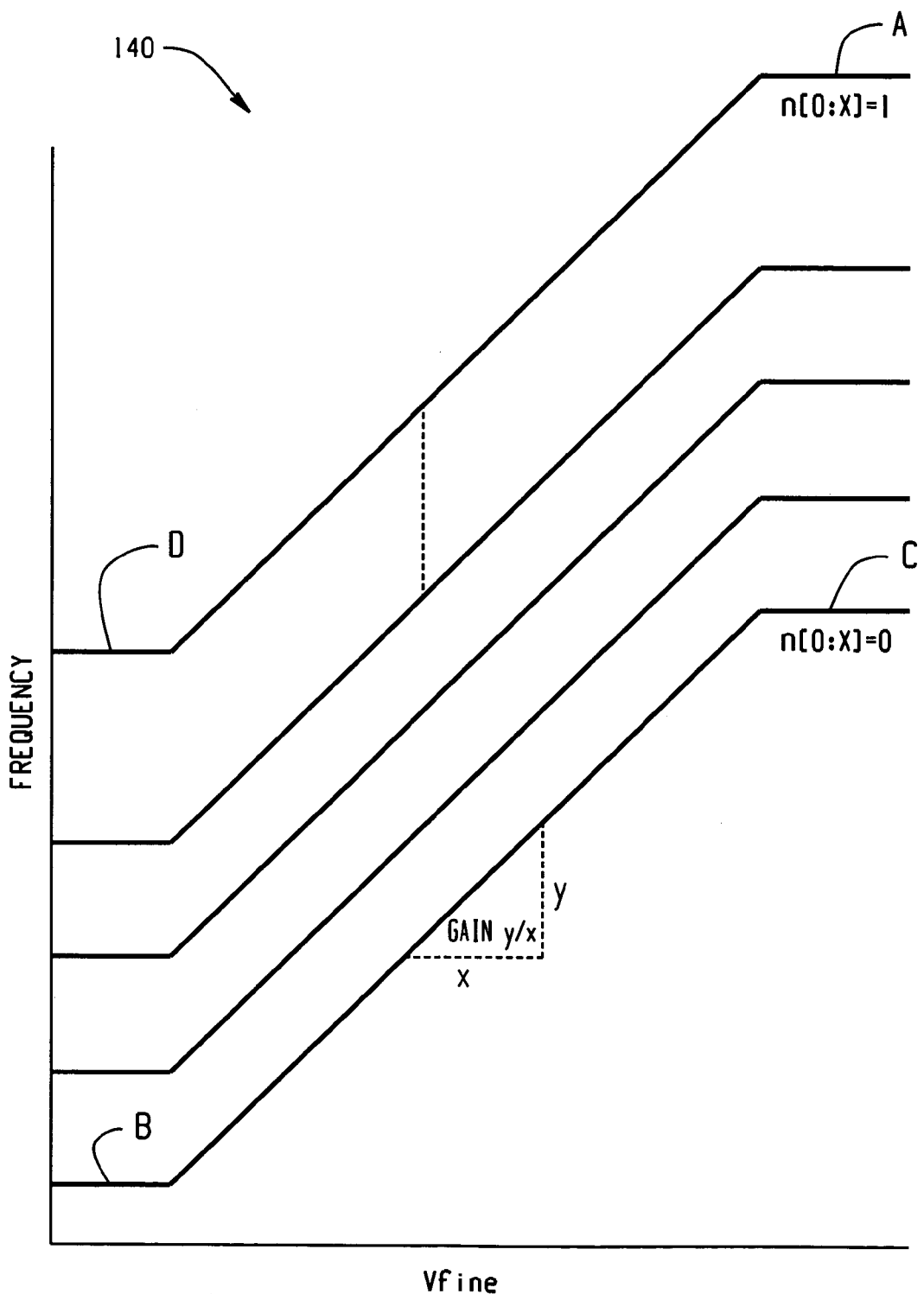
FIG. 7 is a graph illustrating example operations of a tunable ring oscillator.

FIG. 7 is a graph 140 illustrating example operations of a tunable ring oscillator. The maximum possible frequency of the oscillator is illustrated at reference A in FIG. 7, and the minimum possible frequency of the oscillator is illustrated at reference B in FIG. 7. Cross-referencing FIGS. 5 and 7, the coarse tune setting 112 determines the maximum and minimum frequencies of the oscillator and the fine tune control voltage 114 varies the frequency between the maximum and minimum. For example, at the lowest coarse tune setting 114, n[0:x]=0, the frequency of the oscillator may be varied by the fine tune control voltage 114 from a minimum frequency illustrated at reference B to a maximum frequency illustrated at reference C. Similarly, at the highest coarse tune setting 114, n[0:X]=1, the frequency of the oscillator may be varied by the fine tune control voltage 114 from a minimum frequency illustrated at reference D to a maximum frequency illustrated at reference A. Other coarse tune settings 112 between the maximum and minimum settings are also illustrated in FIG. 7.

Referring again to FIG. 5, the maximum possible frequency of the oscillator 90 (reference A in FIG. 7) is defined by selecting the shortest time delay through the ring 90. The delay is shortest when the fine tuning input 114 (Vfine) is set to bypass the delay through a1 and b1 (and a2 and b2) and the coarse tuning input 112 is set to bypass the delay through d1 (and d2). In this case, the minimum delay through the loop is $2*(c1+e1)$, and the resultant maximum frequency is $1/(4*(c1+e1))$. The fine tuning input 114 (Vfine) may, for example, be set to bypass the delay through a1 and b1 by setting the control voltage Vfine to a maximum value. The coarse tuning input 112 may, for example, be set to bypass the delay through d1 by setting all of the bits of the control word n[0:X] to a logic high state (n[0:X]=1). At this maximum coarse tune setting 112, the minimum frequency of the oscillator 90 (reference D in FIG. 7) is $1/(4*(b1+c1+e1))$.

The minimum possible frequency of the oscillator 90 (reference B in FIG. 7) is defined by selecting the longest time delay through the ring 90. The delay is longest when the coarse tuning input 112 is set to include the total delay from a1 and d1 (and a2 and d2) and the fine tuning input 114 (Vfine) is set to include the total delay from a1 and b1 (and a2 and b2). In this case, the maximum delay through the loop is $2*(a1+b1+c1+d1+e1)$, and the resultant minimum frequency is $1/(4*(a1+b1+c1+d1+e1))$. The fine tuning input 114 (Vfine) may, for example, be set to include the total delay from a1 and b1 (and a2 and b2) by setting the control voltage Vfine to a minimum value. The coarse tuning input 112 may, for example, be set to include the total delay from a1 and d1 (and a2 and d2) by setting all of the bits of the control word n[0:X] to a logic low state (n[0:X]=0). At this minimum coarse tune setting 112, the maximum frequency of the oscillator 90 (reference C in FIG. 7) is $1/(4*(c1+d1+e1))$.

Figure 6:
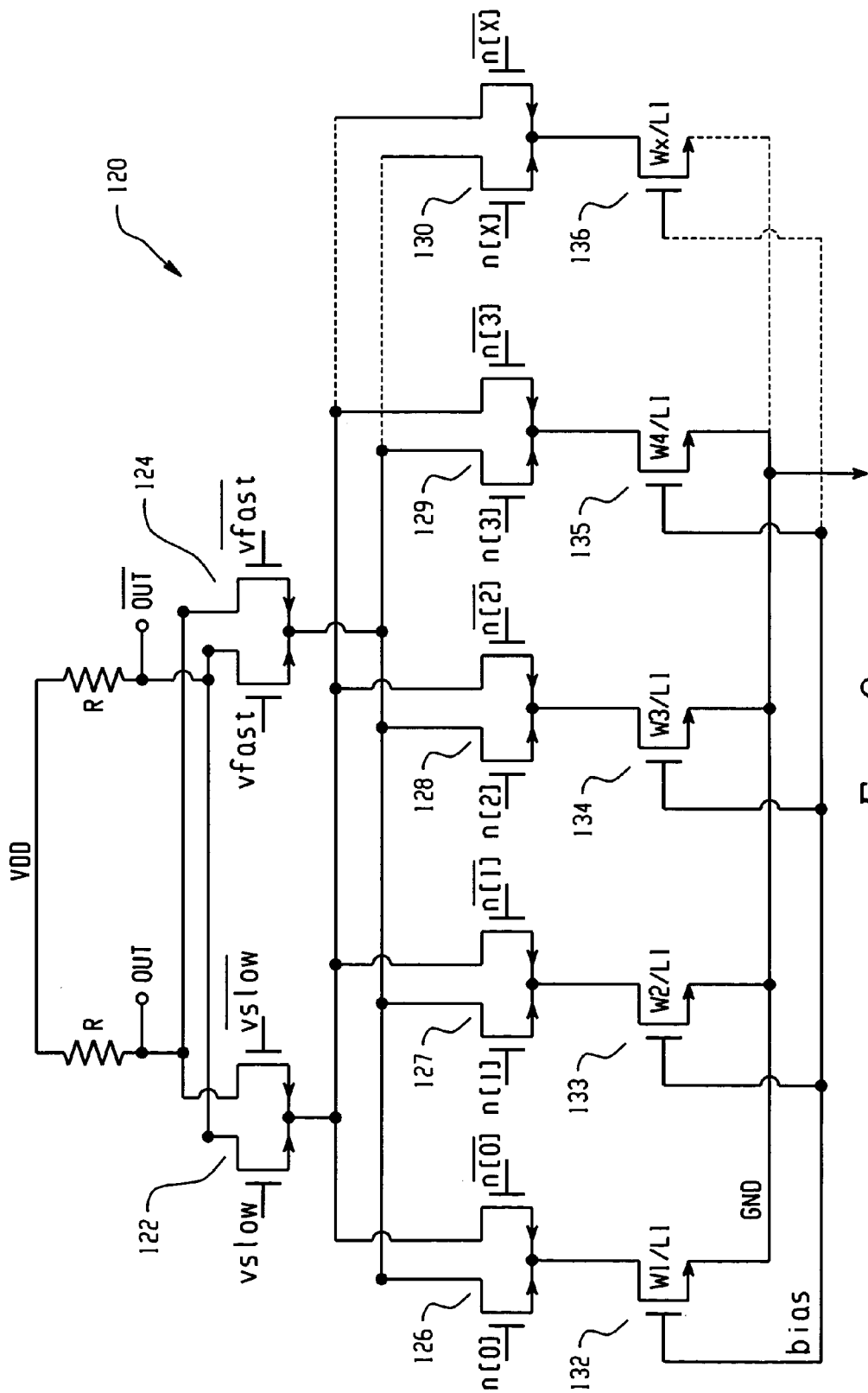
FIG. 6 is a schematic diagram of an example digital mixer for coarse tuning a tunable ring oscillator.

FIG. 6 is a schematic diagram of an example digital mixer 120 for coarse tuning a tunable ring oscillator. The mixer 120 includes a first differential input 122 (Vslow), a second differential input 124 (Vfast), a plurality of control word differential inputs 126–130, and a plurality of weighted current sources 132–136. It should be understood, however, that the circuit of FIG. 6, as well as the circuits of FIGS. 1–5, may be implemented using either differential or single-ended circuit components.

In operation, the control word input 126–130 to the mixer 120 causes the weighted current sources 132–136 to be switched in sequentially from the slow path 122 to the fast path 124 as the control word n[0:X] 126–130 increases in value. Each of the current sources 132–136 have pre-defined W/L ratios (W1/L1, W2/L1 ... WX/L1), which control the weighting of the current sources 132–136. The sum of all of the currents in the current sources 132–136 remains constant, but the path of the current varies with the choice of the control word 126–130. When more current is routed to the fast path 124, more weighting is given to the time delay present at the second differential input 124 (Vfast). Similarly, when more current is routed to the slow path 122, more weighting is given to the time delay present at the first differential input 122 (Vslow). The W/L ratios (W1/L1, W2/L1 ... WX/L1) for each of the current sources 132–136 may, for example, be programmed or otherwise selected to define the frequency difference between coarse tune settings 112.

Figure 8:
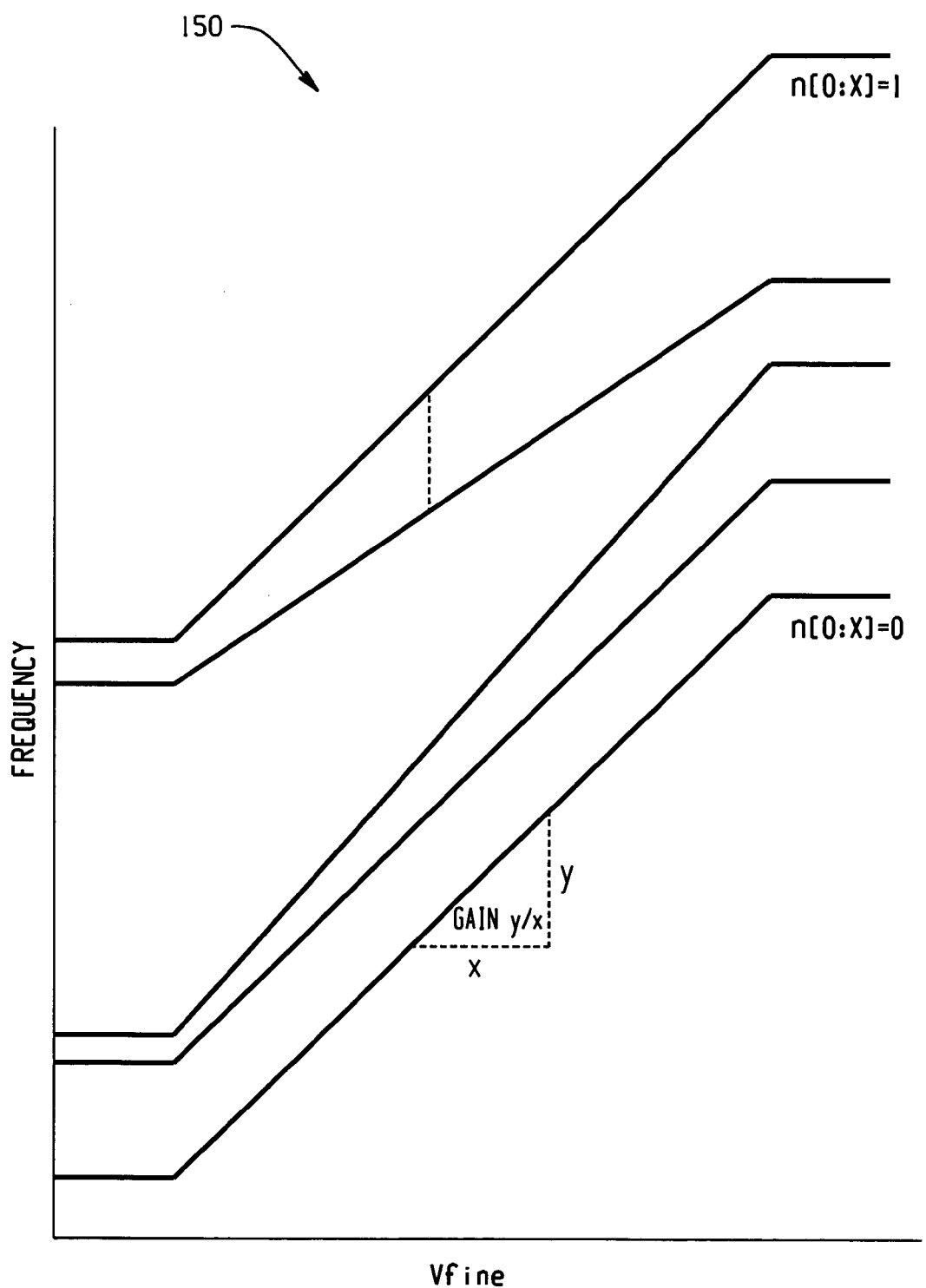
FIG. 8 is a graph illustrating additional example operations of a tunable ring oscillator.

This written description uses examples to disclose the invention, including the best mode, and also to enable a person skilled in the art to make and use the invention. The patentable scope of the invention may include other examples that occur to those skilled in the art. For instance, in one example, the current weighting (W/L) in the first digital mixer (b1 and b2) may be different than the current weighting (W/L) in the second digital mixer (e1 and e2) at one or more coarse tune settings 112, resulting in different gains for some or all of the coarse tune settings 112, as illustrated in FIG. 8. That is, the maximum and minimum frequencies for each coarse tune setting may be independently set by programming or otherwise selecting the W/L ratios (e.g., W1/L1, W2/L1 ... WX/L1), thus defining independent gains for each coarse tune setting.

It is claimed:

1. A tunable ring oscillator having a delay circuit, the delay circuit comprising:
   a first fixed time delay operable to receive a delay signal input and to generate a first delayed signal;
   fine tuning circuitry for mixing the delay signal input and the first delayed signal as a function of a fine tuning input;
   a fast path delay operable to apply a second fixed time delay to an output signal of the fine tuning circuitry to generate a second delayed output;
   a slow path delay operable to apply a third fixed time delay to the output signal of the fine tuning circuitry to generate a third delayed output; and
   coarse tuning circuitry for setting one of a minimum time delay or a maximum time delay as a function of a coarse tuning input;
   wherein the coarse tuning circuitry is operable to set one of the minimum time delay or the maximum time delay by mixing the second delayed output signal and the third delayed output signal as a function of the coarse tuning input.

2. The tunable ring oscillator of claim 1, wherein the delay circuit further comprises a delay element operable to receive an input signal and delay the input signal to generate a delayed output signal.

3. The tunable ring oscillator of claim 2, wherein the delay element is a buffer.

4. The tunable ring oscillator of claim 1, wherein the coarse tuning circuitry is a digital mixer.

5. The tunable ring oscillator of claim 4, wherein the coarse tuning input is a digital control word.

6. The tunable ring oscillator of claim 1, wherein the fine tuning circuitry is an analog mixer.

7. The tunable ring oscillator of claim 6, wherein the fine tuning input is a control voltage input to the tunable ring oscillator.

8. The tunable ring oscillator of claim 1, wherein another one of the minimum time delay and the maximum time delay has a fixed value.

9. The tunable ring oscillator of claim 1, wherein the coarse tuning circuitry sets the maximum time delay, the delay circuit further comprising:
second coarse tuning circuitry for setting the minimum time delay.

10. The tunable ring oscillator of claim 9, wherein the second coarse tuning circuitry is operable to set the minimum time delay as a function of the coarse tuning input.

11. The tunable ring oscillator of claim 9, wherein the second coarse tuning circuitry is operable to set the minimum time delay as a function of a second coarse tuning input.

12. The tunable ring oscillator of claim 10, wherein the delay circuit further comprises:

a first delay element operable to apply a first fixed time delay to a delay element input signal to generate a first delayed output signal; and a second delay element operable to apply a second fixed time delay to a fine tuning circuitry output signal to generate a second delayed output signal;

wherein the coarse tuning circuitry is operable to set the maximum time delay by mixing the delay element input signal and the first delay output signal as a function of the coarse tuning input, and the second coarse tuning circuitry is operable to set the minimum time delay by mixing the fine tuning circuitry output signal and the second delayed output signal as a function of the coarse tuning input.

13. The tunable ring oscillator of claim 12, wherein the first and second delay elements are buffers.

14. The tunable ring oscillator of claim 12, wherein the coarse tuning circuitry and the second coarse tuning circuitry are digital mixtures and the coarse tuning input is a digital control word.

15. The tunable ring oscillator of claim 10, wherein the coarse tuning input includes a predetermined number of settings, and wherein the coarse tuning circuitry and the second coarse tuning circuitry are configured to apply a predetermined current weighting at each of the settings.

16. The tunable ring oscillator of claim 15, wherein the predetermined current weighting defines a constant oscillator gain having an equal value at each of the settings.

17. The tunable ring oscillator of claim 15, wherein the predetermined current weighting creates different oscillator gain values at two or more of the settings.

* * * * *